(12) United States Patent
Zhou et al.

(10) Patent No.: US 9,666,491 B1
(45) Date of Patent: May 30, 2017

(54) METHOD OF FORMING SEMICONDUCTOR DEVICE (71) Applicant: UNITED MICROELECTRONICS CORP., Hsin-Chu (TW)

(72) Inventors: Zhibiao Zhou, Singapore (SG); Ding-Lung Chen, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/185,007

(22) Filed: Jun. 16, 2016

(51) Int. Cl.
| | |
|---|---|
| *H01L 23/48* | (2006.01) |
| *H01L 21/768* | (2006.01) |
| *H01L 23/00* | (2006.01) |
| *H01L 21/8256* | (2006.01) |
| *H01L 23/528* | (2006.01) |
| *H01L 27/088* | (2006.01) |
| *H01L 29/66* | (2006.01) |
| *H01L 49/02* | (2006.01) |
| *H01L 21/477* | (2006.01) |
| *H01L 21/428* | (2006.01) |
| *H01L 29/40* | (2006.01) |

(52) U.S. Cl.
CPC ........ *H01L 21/8256* (2013.01); *H01L 21/428* (2013.01); *H01L 21/477* (2013.01); *H01L 23/5283* (2013.01); *H01L 24/19* (2013.01); *H01L 27/088* (2013.01); *H01L 28/40* (2013.01); *H01L 29/401* (2013.01); *H01L 29/66969* (2013.01)

(58) Field of Classification Search
CPC . H01L 29/24; H01L 27/1225; H01L 29/7869; H01L 29/4908; H01L 29/45; H01L 24/19
USPC ........................................................ 438/667
See application file for complete search history.

(56) References Cited

U.S. PATENT DOCUMENTS

| | | | |
|---|---|---|---|
| 9,136,153 B2 | 9/2015 | Or-Bach et al. | |
| 2013/0105968 A1 | 5/2013 | Lu et al. | |
| 2013/0299818 A1* | 11/2013 | Tanaka | .................... H01L 29/78 257/43 |
| 2014/0118059 A1* | 5/2014 | Kim | .................. H01L 21/76898 327/535 |
| 2014/0183529 A1 | 7/2014 | Yamazaki et al. | |

FOREIGN PATENT DOCUMENTS

WO      2016048753      3/2016

* cited by examiner

*Primary Examiner* — Thomas L Dickey
*Assistant Examiner* — Changhyun Yi
(74) *Attorney, Agent, or Firm* — Winston Hsu; Scott Margo (57) ABSTRACT

A method of forming a semiconductor device includes following steps. Firstly, a first transistor is formed on a first surface of a substrate. Next, a thinning process is performed on the second surface of the substrate which is opposite to the first surface, to form a third surface. Then, a second transistor is formed on the third surface, in which the second transistor and the first transistor are electrically connected to each other through a through-silicon via penetrating through the first surface and the third surface.

9 Claims, 6 Drawing Sheets

METHOD OF FORMING SEMICONDUCTOR DEVICE

BACKGROUND OF THE INVENTION

1. Field of the Invention

The present invention relates to a method of forming a semiconductor device, and more particularly to a method of forming a semiconductor device having an oxide semiconductor field-effected transistor (OSFET).

2. Description of the Prior Art

In modern society, the micro-processor systems comprising integrated circuits (IC) are ubiquitous devices, being utilized in diverse fields such as automatic control electronics, mobile communication devices and personal computers. With the development of technology and the increase of original applications for electronic products, the IC devices are becoming smaller, more delicate and more diversified.

In a wide variety of materials, indium oxide ($In_2O_3$), tin oxide ($SnO_2$) and zinc oxide (ZnO) are generally known transparent conductive oxides. Indium tin oxide (ITO), when being formed of a thin film, can be used as a transparent electrode in a flat panel display or a touch sensor of a capacitance type touch panel. Tin oxide and zinc oxide can be used in a transparent solar cell electrode. However, these materials are essentially semiconductor materials, and it is desired for researchers to develop a semiconductor device by using their semiconductor material properties, such as an oxide semiconductor transistor.

However, due to oxidation of the semiconductor material itself, when using this oxide semiconductor material, it is easy to damage the oxide semiconductor layer during the production process, thus affecting the performance of the product. Therefore, for a semiconductor device having an oxide semiconductor material, there is still a need for a better design, thereto gain better quality.

SUMMARY OF THE INVENTION

It is one of the primary objectives of the present invention to provide a method of forming a semiconductor device, in which an oxide semiconductor field-effect transistor (OSFET) and a silicon field-effect transistor (SiFET) are respectively formed on two opposite surfaces of a substrate thereto avoid the damage of the OSFET.

To achieve the purpose described above, one embodiment of the present invention provides a method of forming a semiconductor device including following steps. First of all, a substrate is provided, which has a first surface and a second surface opposite to the first surface. Then, a first transistor is formed on the first surface of the substrate. Next, a thinning process is performed on the second surface of the substrate to form a third surface, and a first insulating layer is then formed on the third surface of the substrate. After that, an oxide semiconductor (OS) layer is formed on the first insulating layer, and a source and a drain are formed on the OS layer. Then, a second insulating layer is formed to cover the source, the drain and the OS layer, and a first gate electrode is formed on the OS layer between the source and the drain, wherein the OS layer, the second insulating layer, the source, the drain and the first gate electrode together form a second transistor on the third surface. Finally, a first annealing process is performed to form a seal layer covering the second transistor.

According to the above, the method of the present invention utilizes a multi-annealing process to form each insulating layer within the OSFET, for reducing the diffused mist and hydrogen in the insulating layer for example to less than 1%. With such performance, the method of the present invention may sufficiently block out-diffused mist and hydrogen in the device, thereby avoiding possible out-diffused mist and hydrogen flowing along the metal interconnect structure and affecting the OSFET. Also, in the method of the present invention, the silicon FET and the OSFET are separately formed on two opposite surfaces of the substrate. For example, the silicon FET is directly formed on one surface of the substrate, and the OSFET is directly formed on another surface opposite to the surface after a thinning process, such that, the silicon FET and the OSFET may interconnect with each other though the subsequently formed TSV which is penetrated though the two opposite surfaces. Thus, the OSFET will no longer be affected by the formation of the TSV, therefore gaining better elemental quality and device performance.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 9 are schematic diagrams illustrating a method of forming a semiconductor device according to a first embodiment of the present invention, wherein:

FIG. 10 to FIG. 11 are schematic diagrams illustrating a method of forming a semiconductor device according to a second embodiment of the present invention, wherein:

DETAILED DESCRIPTION

To provide a better understanding of the presented invention, preferred embodiments will be described in detail. The preferred embodiments of the present invention are illustrated in the accompanying drawings with numbered elements.

Figure 1:
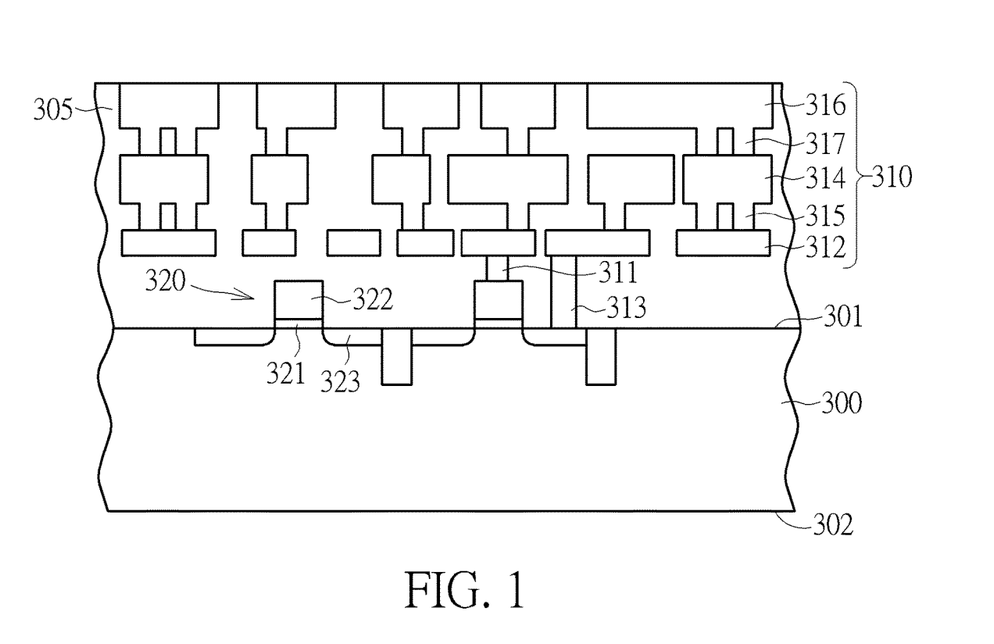
FIG. 1 shows a semiconductor device at the beginning of the forming process.

Please refer to FIG. 1 to FIG. 9, which are schematic diagrams illustrating a method of forming a semiconductor device according to the first embodiment of the present invention. As shown in FIG. 1, a semiconductor substrate 300 like a silicon containing substrate, an epitaxial substrate or a silicon-on-insulator substrate is firstly provided to include two opposite surfaces 301, 302, and at least one transistor 320 is formed on the semiconductor substrate 300. In the present embodiment, two transistor 320 are separately formed on the first surface 301 of the semiconductor substrate 300, each including a gate insulating layer 321 such as silicon dioxide ($SiO_2$), silicon nitride (SiN) or a high dielectric constant (high-k) material, a gate electrode 322 such as undoped/doped polysilicon, amorphous silicon or metals, and two source/drain regions 323 at two sides of the gate electrode 322 in the semiconductor substrate 300.

Furthermore, a metal interconnection structure 310 disposed in a first dielectric layer 305 is then formed on the first surface 301 of the substrate 300. The metal interconnection structure 310 includes contact plugs 311, 313, metal layers 312, 314, 316 and via plugs 315, 317, and terminals (such as the gate electrode 322 and/or the source/drain regions 323) of the transistors 320 are electrically connected to the metal layer 312 through the contact plugs 311, 313 respectively as shown in FIG. 1. In one embodiment, the first dielectric layer 305 may include a monolayered inter-layer dielectric (ILD) film or a multilayered ILD film, for example including silicon oxide, silicon nitride, silicon oxynitride, or other low-k dielectric materials. Also, in another embodiment, the metal layer 314 and the via plug 315, and the metal layer 316 and the via plug 317 are formed in a dual damascene structure for example through a copper (Cu) damascene technique, but is not limited thereto.

Figure 2:
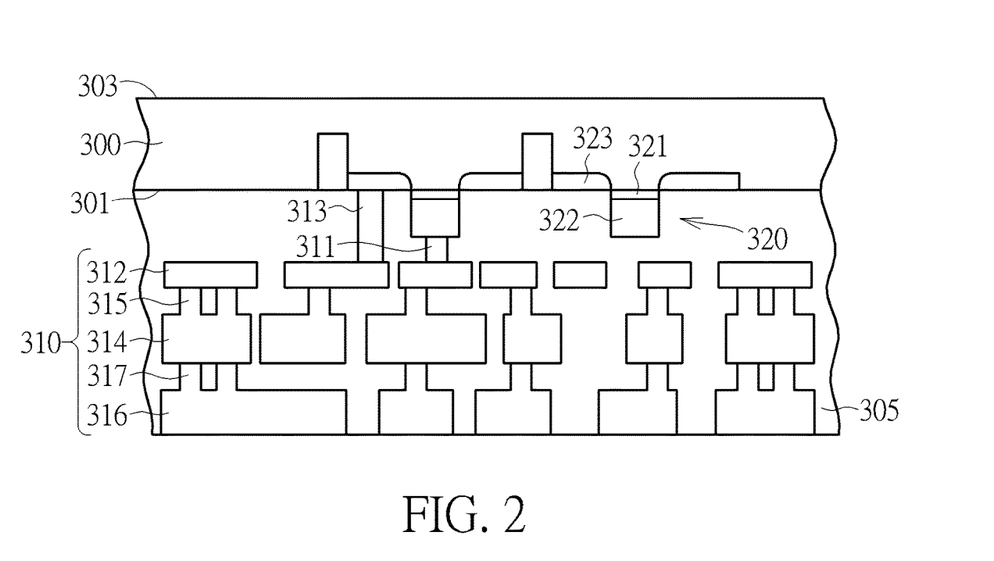
FIG. 2 shows a semiconductor device after performing a thinning process.

Then, a thinning process is performed to form a third surface 303 opposite to the first surface 301. For example, a chemical mechanical polishing (CMP) process or an etching process is performed from the second surface 302 to the first surface 301 of the semiconductor substrate 300, to reduce the overall thickness of the semiconductor substrate 300, as shown in FIG. 2.

Figure 3:
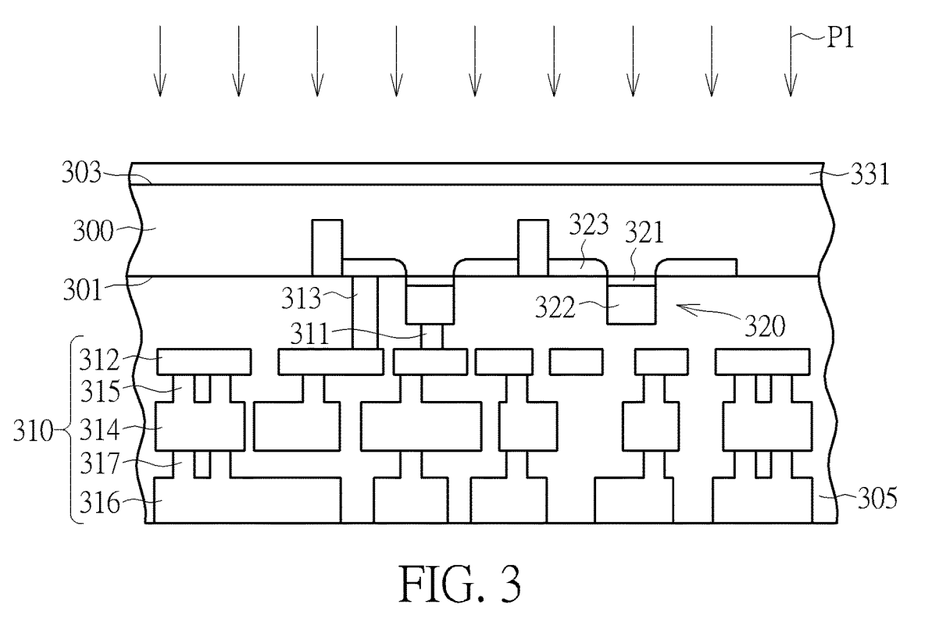
FIG. 3 shows a semiconductor device after performing a first annealing process.

Next, a first insulating layer 331 is formed on the third surface 303 of the semiconductor substrate 300 and a first annealing process P1 is performed on the first insulating layer 331. For example, the first annealing process P1 is performed through a rapid thermal process (RTP) or a laser spike annealing (LSA) process. In one embodiment the RTP is performed on the first insulating layer 331 at a processing temperature of about 500° C. to 1000° C., preferably with oxygen or nitrogen gas imported or performing at one atmosphere. That is, the diffused mist and hydrogen within the first insulating layer 331 can be significantly reduced to less than 1% as shown in FIG. 3.

Figure 4:
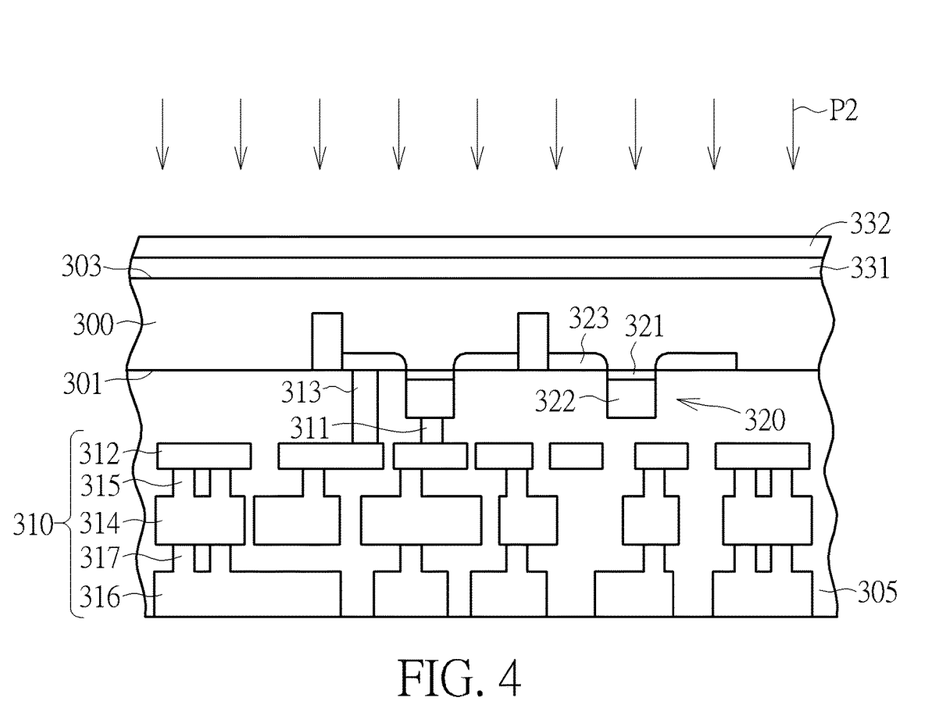
FIG. 4 shows a semiconductor device after performing an oxygen treatment.

An oxide semiconductor (OS) layer 332 such as including indium gallium zinc oxide (InGaZnO), indium gallium oxide (IGaO), indium zinc oxide (IZO), indium zinc oxide (IZO) or a c-axis aligned crystalline OS (CAAC-OS) material is then formed on the first insulating layer 331 and an oxygen treatment P2 is optionally performed on the OS layer 332. For example, the oxygen treatment P2 is performed through an oxygen-containing annealing process, an oxygen-containing plasma treatment process or an oxygen-containing chemical treatment process. In one embodiment, the oxygen-containing annealing process may include supplying gas containing $O_2$ at a processing temperature between 300° C. and 500° C. for about 10 to 30 seconds; the oxygen-containing plasma treatment process may include using plasma containing $O_2$; and the oxygen-containing chemical treatment may include using a chemical solvent containing $NH_4OH$, $H_2O_2$ and $H_2O$, such as SC1 solvent, but is not limited thereto. With this treatment, the oxygen in the OS layer 332 can be significantly maintained at 50% to 60% as shown in FIG. 4.

Figure 5:
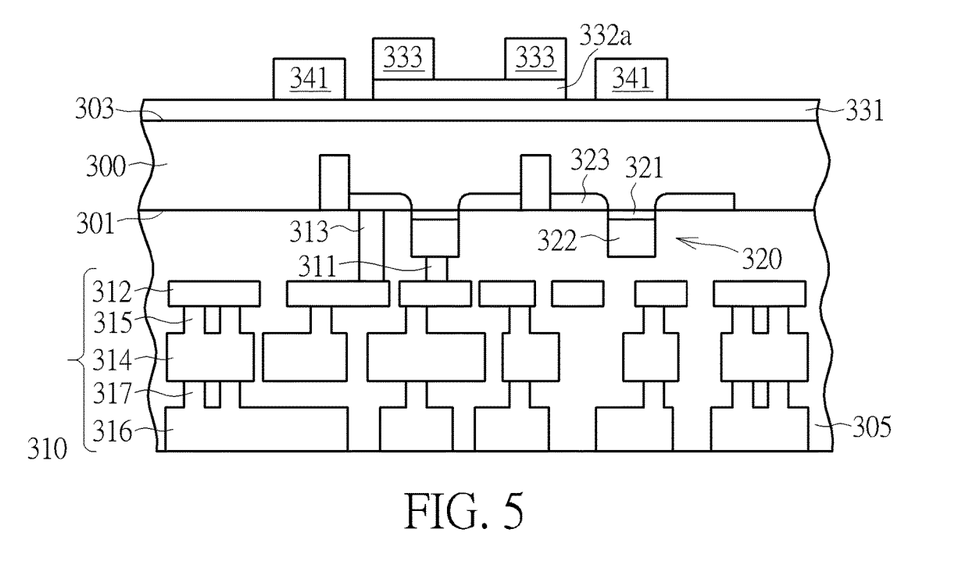
FIG. 5 shows a semiconductor device after forming a source and a drain.

Following these, the OS layer 332 is patterned and a source 333 and a drain 333 and at least one metal layer 341 are formed on the first insulating layer 331. In one embodiment, the formation of the source 333 and the drain 333 may include firstly forming a conductive layer (not shown in the drawings) covering the patterned OS layer 332a shown in FIG. 5, and performing a patterning process, for example through at least one photolithographic process and/or an etching process by using the first insulating layer 331 as a stop layer, to pattern the conductive layer and to form the source 333, the drain 333 and the metal layers 341. Specifically, the source 333 and the drain 333 are separately formed on a patterned OS layer 332a, and two metal layers 341 are separately formed on the first insulating layer 331, as shown in FIG. 5. However, it is understood that the first insulating layer 331 shown in FIG. 4 may also be pattered while the OS layer 332 is patterned in another embodiment, thereto form a patterned OS layer (not shown in the drawings) and a patterned first insulating layer (not shown in the drawings) with vertical aligned sidewalls.

Figure 6:
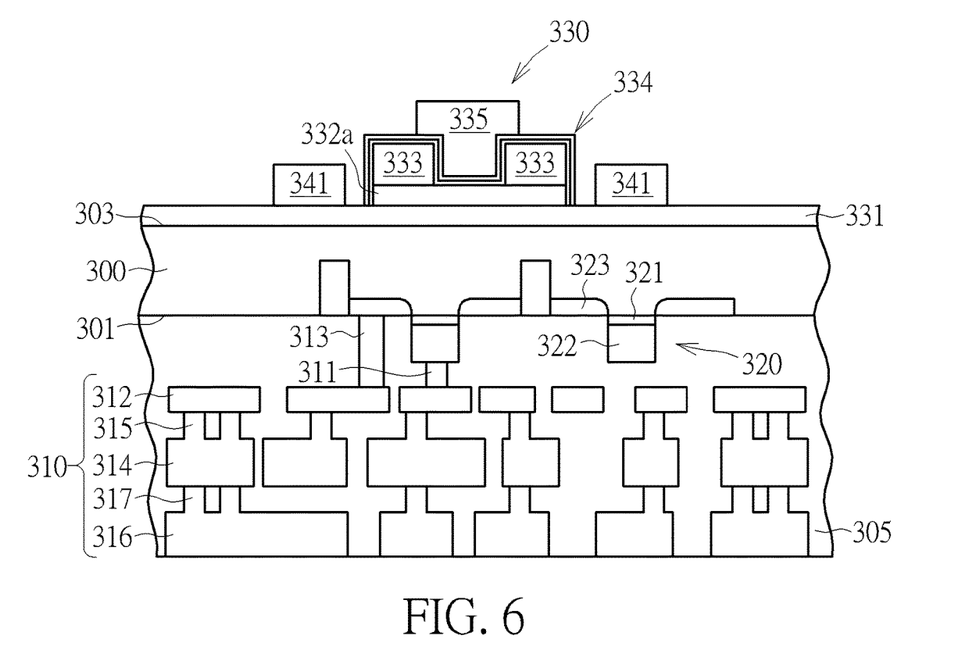
FIG. 6 shows a semiconductor device after forming an OSFET.

Then, a second insulating layer 334 and a gate electrode 335 are sequentially formed on the source 333 and the drain 333, wherein the second insulating layer 334 is disposed between the gate electrode 335 and the source 333 and the drain 333. In one embodiment, the second insulating layer 334 may include a monolayer film or a multilayer film as shown in FIG. 6, for example including a high-k dielectric layer like $HfO_2$ or aluminum oxide ($Al_2O_3$), but is not limited thereto. Preferably, each film of the multilayer second insulating layer 334 may include different materials, and the outermost film may include an OS material like InGaZnO, $InGaO_2$ or $InZnO_2$. Thus, the first insulating layer 331, the OS layer 332a, the multilayer second insulating layer 334 and the gate electrode 335 may together form an OS field-effect transistor (OSFET) 330 as shown in FIG. 6.

Figure 7:
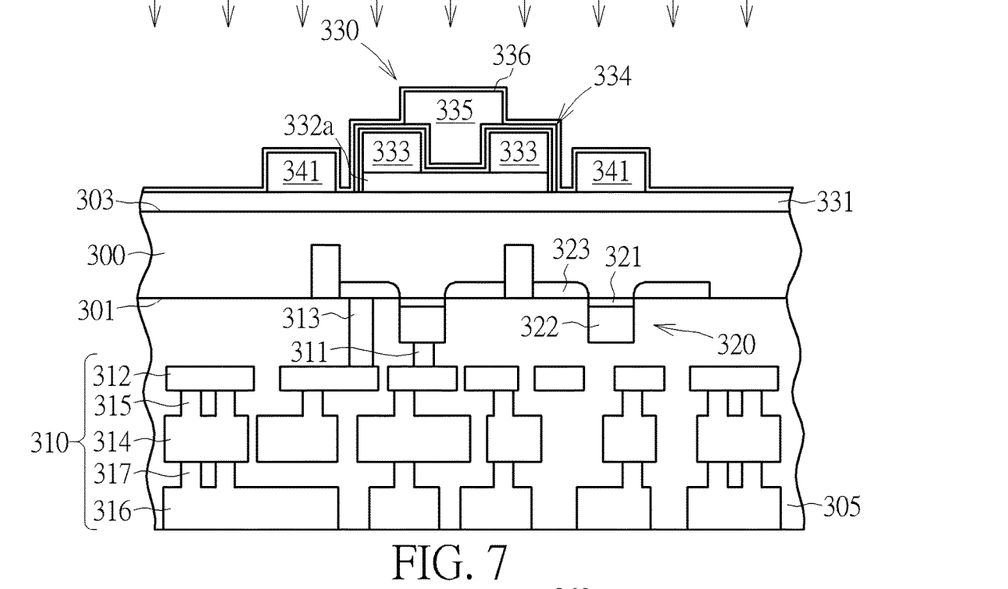
FIG. 7 shows a semiconductor device after performing a second annealing.

Furthermore, in a preferred embodiment, after the OSFET 330 is formed directly on the third surface 303 of the semiconductor substrate 300, a seal layer 336 for example including a dense dielectric material like $HfO_2$ or $Al_2O_3$ is further formed on the OSFET 330 to encompass the entire OSFET 330 and the metal layers 341, and a second annealing process P3 is performed on the seal layer 336. For example, the second annealing process P3 is also performed through a RTP or a LSA process. In one embodiment the RTP is performed on the seal layer 336 at a processing temperature of about 500° C. to 1000° C., preferably with oxygen or nitrogen gas imported or performing at one atmosphere. That is, the diffused mist and hydrogen within the seal layer 336 can be significantly reduced to less than 1% as shown in FIG. 7. In one embodiment, the seal layer 336 may be further patterned to only cover the OSFET 330, and the second annealing process P3 may be optionally performed either before or after the seal layer 336 is patterned.

Figure 8:
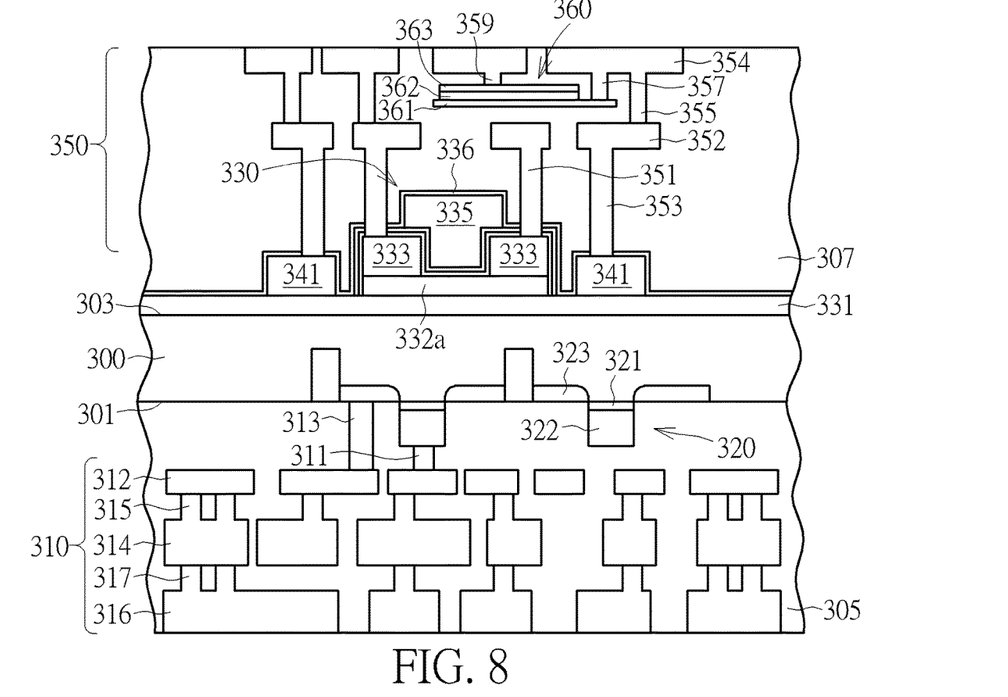
FIG. 8 shows a semiconductor device after forming an interconnect structure.

Next, a metal interconnection structure 350 disposed in a second dielectric layer 307 is then formed on the third surface 303 of the substrate 300 for electrically connecting the OSFET 330. The metal interconnection structure 350 includes via plugs 351, 353, metal layers 352, 354 and via plugs 355, 357, 359 and terminals (such as the source 333 and the drain 333) of the OSFET 330 are electrically connected to the metal layer 352 through the via plugs 351 respectively as shown in FIG. 8. On the other hand, the metal layers 341 formed while the source 333 and the drain 333 are formed are also electrically connected to the metal layer 352 through the via plugs 353. In one embodiment, the second dielectric layer 307 may include a monolayered ILD film or a multilayered ILD film, for example including silicon oxide, silicon nitride, silicon oxynitride, or other low-k dielectric materials, and the metal layer 352 and the via plugs 351, 353, and the metal layer 356 and the via plugs 355, 357, 359 are formed in a dual damascene structure for example through a copper damascene technique, but is not limited thereto.

Also, a capacitor structure 360 is formed to electrically connect to the OSFET 330. The capacitor structures 360 include a bottom plate (BP) electrode 361 such as a titanium nitride (TiN) or a tungsten (W) layer, a high-k dielectric layer 362 such as a $HfO_2$ or $Al_2O_3$ layer, and a top plate (TP) electrode 363 stacked one over another in the second dielectric layer 307 as shown in FIG. 8. For example, the BP electrode 361 is electrically coupled to the metal layer 341 through at least the metal layers 354, 352 and the via plugs 353, 355, 357 as shown in FIG. 8.

Figure 9:
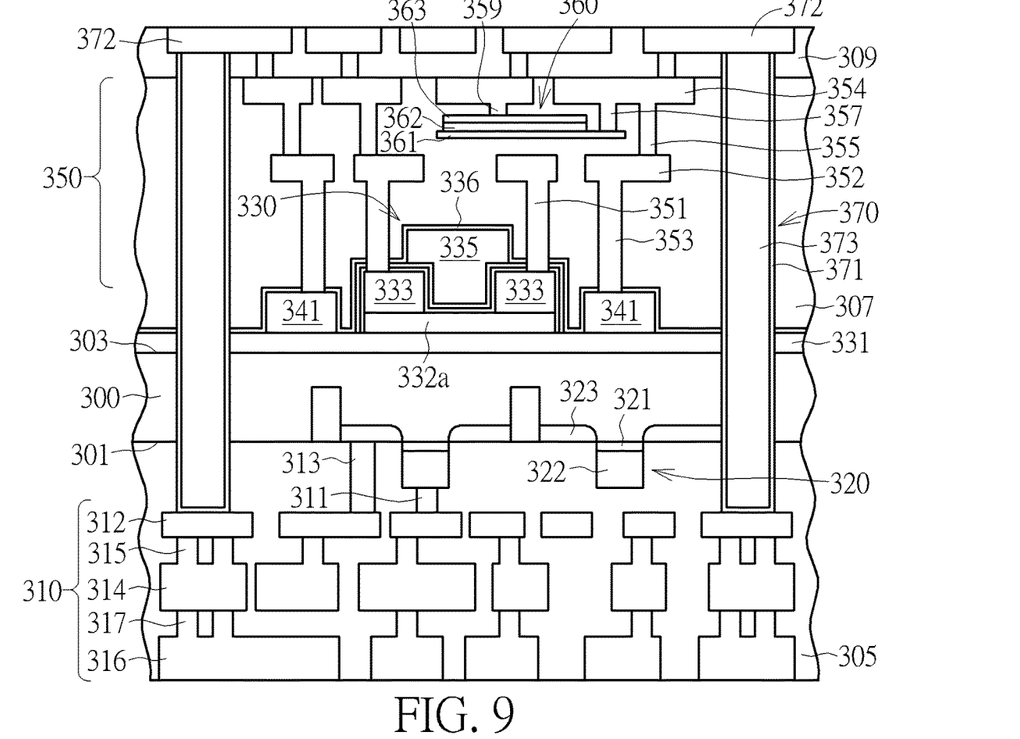
FIG. 9 shows a semiconductor device after forming a through silicon via.

After that, a through-silicon via (TSV) 370 is formed to connect the third surface 303 and the first surface 301 of the semiconductor substrate 300. The formation of the TSV 370 may include firstly forming a penetration via (not shown in the drawings) from the third surface 303 to the first surface 301 of the semiconductor substrate 300, in which the penetration via penetrates through the second dielectric layer 307, the third surface 303, the semiconductor substrate 300, first surface 301 and a portion of the first dielectric layer 305 by using the metal layer 312 as a stop layer for example. That is, the TSV 370 formed in the penetration via may electrically connect to the metal layer 312 disposed in the first dielectric layer 305 on the first surface 301 of the semiconductor substrate 300, as shown in FIG. 9. In one embodiment, the TSV 370 includes a barrier layer 371 such as including nitride titanium (TiN), titanium (Ti), tantalum nitride (TaN), tantalum (Ta) or combinations thereof, and a conductive layer 373 such as copper or tungsten (W).

Then, a metal layer 372 disposed in a third dielectric layer 309 on the second dielectric layer 307 is formed thereto electrically connect the OSFET 330 formed on the third surface 303 of the semiconductor substrate 300. However, it is understood that the metal layer 372 and the TSV 370 may also be formed through the same forming process in another embodiment, such that, the metal layer and the TSV may be monolithic (not shown in the drawings). It is noted that the OSFET 330 formed on the third surface 303 of the semiconductor substrate 300 is able to electrically connect to the transistor 320 formed on the first surface 301 of the semiconductor substrate 300 through the TSV 370, as shown in FIG. 9.

According to the method of forming a semiconductor device in the present invention, at least one annealing process, such as a RTP or a LSA process is performed to form the insulating layers within the OSFET, thereto reduce the hydrogen therein to less than 1% in those insulating layers. Also, through the method above, the OSFET and the silicon FET are respectively formed on two opposite surfaces. Namely, the silicon FET is firstly formed on one surface of the substrate, the substrate is thinned, the OSFET is then formed on an opposite surface to the surface, and finally the TSV is formed to electrically connect the OSFET and the silicon FET on two opposite surfaces. In this performance, the OSFET will no longer be affected by the formation of the TSV, therefore improving the device performance.

The following description will detail the different embodiments of the semiconductor device of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 10:
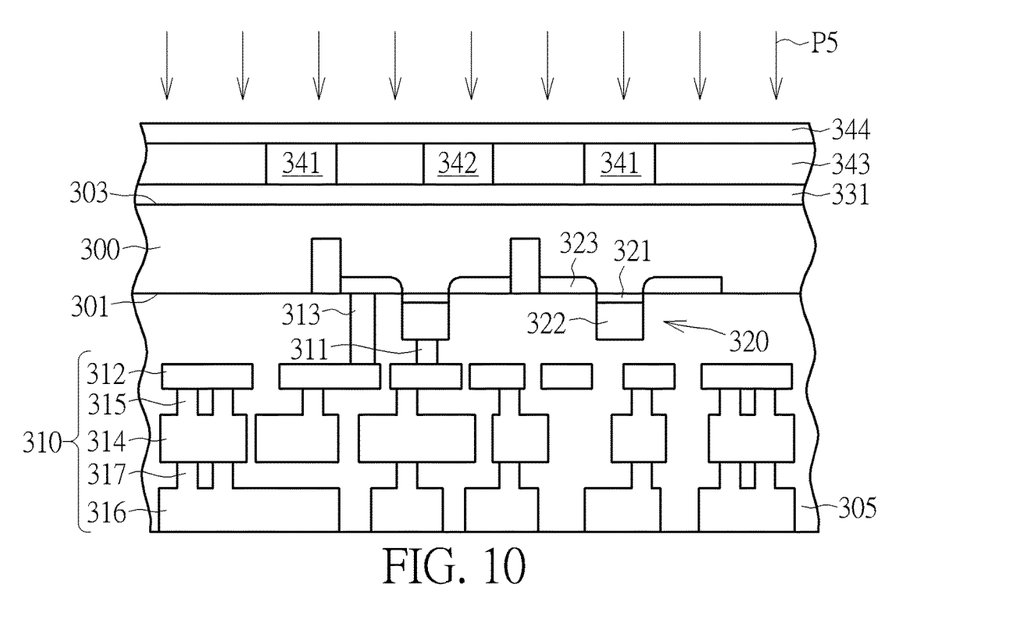
FIG. 10 shows a semiconductor device after performing a third annealing.
Figure 11:
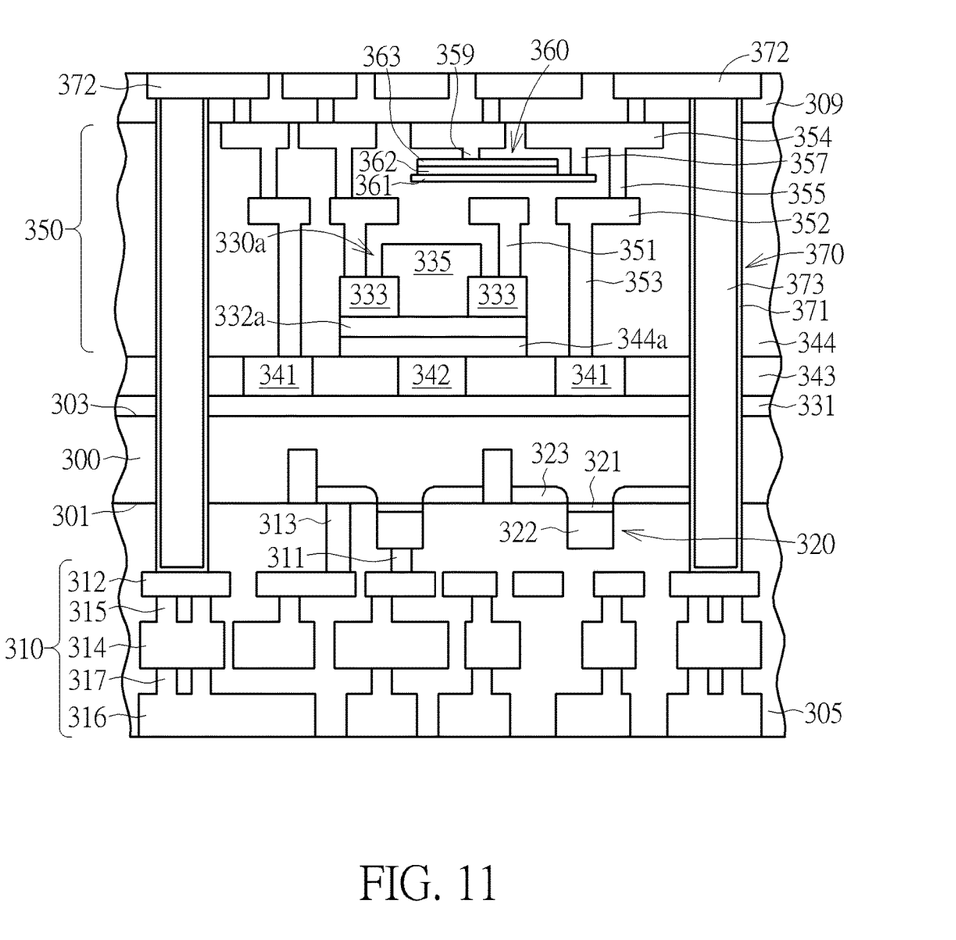
FIG. 11 shows a semiconductor device after forming an interconnect structure.

Please refer to FIGS. 10-11, which are schematic diagrams illustrating a method of forming a semiconductor device according to the second embodiment of the present invention. The formal steps of the present embodiment are substantially similar to those (for example at least FIGS. 1-3) in the method of the first embodiment, and the differences between the present embodiment and the aforementioned first embodiment are that an additional gate electrode 342 is formed right after the first insulating layer 331 is formed. For example, the formation of the gate electrode 342 may be integrated with a forming process of the metal layer 341 shown in FIG. 10 through a copper damascene technique, but is not limited thereto. Then, a third insulating layer 343 is formed to cover the gate electrode 342 and the metal layer 341, wherein the third insulating layer 343 is leveled with the top surfaces of the gate electrode 342 and the metal layers 341. In one embodiment, the third insulating layer 343 may be formed through firstly forming an insulating material layer (not shown in the drawings) covering on the gate electrode 342 and the metal layer 341 and planarizing the insulating material layer to form the third insulating layer 343, but is not limited thereto.

Next, a fourth insulating layer 344 is formed on the third insulating layer 343, and a third annealing process P5 is performed on the fourth insulating layer 344. For example, the third annealing process P5 is also performed through a RTP or a LSA process. In one embodiment the RTP is performed on the fourth insulating layer 344 at a processing temperature of about 500° C. to 1000° C., preferably with oxygen or nitrogen gas imported or performing at one atmosphere. That is, the diffused mist and hydrogen within the fourth insulating layer 344 can be significantly reduced to less than 1% as shown in FIG. 10.

Follow these, processes shown in FIGS. 4-9 of the method in the first embodiment are also performed in the present embodiment, in which, the fourth insulating layer 344 is patterned while the OS layer 332 is patterned, thereby forming the structure shown in FIG. 11. As shown in FIG. 11, a dual gate OSFET 330a which consists of the gate electrode 342, an insulating layer 344a, the OS layer 332a, the source 333 and the drain 333, the second insulating layer 334 and the gate electrode 335 is formed on the third surface 303 of the semiconductor substrate 300 in the present invention. It is noted that, the dual gate OSFET 330a formed on the third surface 303 of the semiconductor substrate 300 is able to electrically connect to the transistor 320 formed on the first surface 301 of the semiconductor substrate 300 through the TSV 370, as shown in FIG. 10.

According to the method of forming a semiconductor device in the present invention, an additional gate electrode 342 is formed below the OS layer 332a, and an additional insulating layer 344a is formed on the gate electrode 342. In this way, a further annealing process P5 such as a RTP or a LSA process is requested to be performed on such additional insulating layer 344a within the dual gate OSFET, thereto reduce the hydrogen therein to less than 1% in those insulating layers. Thus, through the method above, the dual gate OSFET and the silicon FET are respectively formed on two opposite surface. Namely, the silicon FET is firstly formed on one surface of the substrate, the substrate is thinned, the dual gate OSFET is then formed on an opposite surface to the surface, and finally the TSV is formed to electrically connect the dual gate OSFET and the silicon FET on two opposite surfaces. In this performance, the dual gate OSFET will no longer be affected by the formation of the TSV, therefore improving the device performance.

In summary, the method of the present invention utilizes a multi-annealing process to form each insulating layer within the OSFET, for reducing the diffused mist and hydrogen in the insulating layer for example to less than 1%. With such arrangement, the method of the present invention may sufficiently block out-diffused mist and hydrogen in the device, thereby avoiding possible out-diffused mist and hydrogen flowing along the metal interconnect structure and affecting the OSFET. Also, in the method of the present invention, the silicon FET and the OSFET are separately formed on two opposite surfaces of the substrate. For example, the silicon FET is directly formed on one surface of the substrate, and the OSFET is directly formed on another surface opposite to the surface after a thinning process, such that, the silicon FET and the OSFET may interconnect with each other though the TSV penetrated though the two opposite surfaces. In this performance, the OSFET will no longer be affected by the formation of the TSV, therefore gaining better elemental quality and device performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor device, comprising:
    providing a substrate having a first surface and a second surface opposite to the first surface;
    forming a first transistor on the first surface of the substrate;
    performing a thinning process on the second surface of the substrate to form a third surface;
    forming a first insulating layer on the third surface of the substrate;
    forming an oxide semiconductor (OS) layer on the first insulating layer;
    forming a source and a drain on the OS layer;
    forming a second insulating layer covering the source, the drain and the OS layer;
    forming a first gate electrode on the OS layer between the source and the drain, wherein the OS layer, the second insulating layer, the source, the drain and the first gate electrode together form a second transistor on the third surface;
    performing a first annealing process to form a seal layer covering the second transistor;
    forming a second gate electrode on the first insulating layer; and
    performing a second annealing process to form a third insulating layer covering the second gate electrode.

2. The method of forming a semiconductor device according to claim 1, wherein the seal layer comprises less than 1% hydrogen after the first annealing process.

3. The method of forming a semiconductor device according to claim 1, further comprising a capacitor on the second transistor.

4. The method of forming a semiconductor device according to claim 1, wherein the second transistor and capacitor are formed in a first dielectric layer on the third surface of the substrate, and the first transistor is formed in a second dielectric layer on the first surface of the substrate.

5. The method of forming a semiconductor device according to claim 1, further comprising:
    forming a via penetrated through the third surface and the first surface of the substrate, wherein the via is electrically connected the second transistor and the first transistor.

6. The method of forming a semiconductor device according to claim 1, wherein the first annealing process and the second annealing process comprises a rapid thermal process or a laser spike annealing process.

7. The method of forming a semiconductor device according to claim 1, wherein the first insulating layer is formed through a third annealing process.

8. The method of forming a semiconductor device according to claim 7, wherein the third annealing process comprises a rapid thermal process or a laser spike annealing process.

9. A method of forming a semiconductor device, comprising:
    providing a substrate having a first surface and a second surface opposite to the first surface;
    forming a first transistor on the first surface of the substrate;
    performing a thinning process on the second surface of the substrate to form a third surface;
    forming a first insulating layer on the third surface of the substrate;
    forming an oxide semiconductor (OS) layer on the first insulating layer;
    after the forming of the OS layer, performing an oxidation treatment;
    forming a source and a drain on the OS layer;
    forming a second insulating layer covering the source, the drain and the OS layer;
    forming a first gate electrode on the OS layer between the source and the drain, wherein the OS layer, the second insulating layer, the source, the drain and the first gate electrode together form a second transistor on the third surface; and
    performing a first annealing process to form a seal layer covering the second transistor.

* * * * *